(12) United States Patent
Thompson et al.

(10) Patent No.: US 6,902,833 B2
(45) Date of Patent: Jun. 7, 2005

(54) MATERIALS AND STRUCTURES FOR ENHANCING THE PERFORMANCE OR ORGANIC LIGHT EMITTING DEVICES

(75) Inventors: Mark E. Thompson, Anaheim, CA (US); Simona Garon, Santa Monica, CA (US); Raymond Kwong, Plainsboro, NJ (US); Jason Brooks, Los Angeles, CA (US); Min-Hao Michael Lu, Lawrenceville, NJ (US)

(73) Assignees: University of Southern California, Los Angeles, CA (US); Universal Display Corporation, Ewing, NJ (US)

( * ) Notice: Subject to any disclaimer, the term of this patent is extended or adjusted under 35 U.S.C. 154(b) by 0 days.

(21) Appl. No.: 10/405,009

(22) Filed: Apr. 1, 2003

(65) Prior Publication Data

US 2004/0197601 A1 Oct. 7, 2004

(51) Int. Cl.[7] .............................................. H05B 33/12
(52) U.S. Cl. ....................... 428/690; 428/917; 428/212; 313/504; 313/506
(58) Field of Search ................................ 428/690, 917, 428/212; 252/301.16; 313/504, 506

(56) References Cited

U.S. PATENT DOCUMENTS

| | | |
|---|---|---|
| 4,769,292 A | 9/1988 | Tang et al. |
| 5,247,190 A | 9/1993 | Friend et al. |
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |

FOREIGN PATENT DOCUMENTS

| | | |
|---|---|---|
| EP | 1 217 668 A1 | 6/2002 |
| EP | 1 221 473 A | 7/2002 |
| JP | 2001043976 A | 2/2001 |
| JP | 2001076879 A | 3/2001 |
| WO | WO 99/53724 | 10/1999 |

OTHER PUBLICATIONS

M. A. Baldo et al., "Highly efficient phosphorecent emission from organic electroluminescent devices," *Nature*, vol. 395, pp. 151–154. (1998).
M.A. Baldo et al., "Very high–efficiency green organic light–emitting devices based on electrophosphorescence", *Applied Physics Letters*, vol. 75, No. 1, pp. 4–6 (1999).
U.S. Appl. No. 10/173,682 to Forrest et al.
U.S. Appl. No. 09/931,948 to Lu et al.
U.S. Appl. No. 10/233,470 to Shtein et al.
Kinoshita et al., "A Novel Family of Boron–Containing Hole–Blocking Amorphous Molecular Materials for Blue– and Blue–Violet–Emitting Organic Electroluminescent Devices" Adv. Funct. Mater., vol. 12, No. 11 (2002), pp. 780–786.

*Primary Examiner*—Dawn Garrett
(74) *Attorney, Agent, or Firm*—Kenyon & Kenyon

(57) ABSTRACT

A device is provided, having an anode, a cathode, and a first organic layer disposed between the anode and the cathode. The first organic layer is capable of phosphorescent emissive when a voltage is applied between the anode and the cathode. A second organic layer disposed between the first organic layer and the cathode is also provided. The second organic layer is in direct contact with the first organic layer. The second organic layer may comprise a material having the structure:

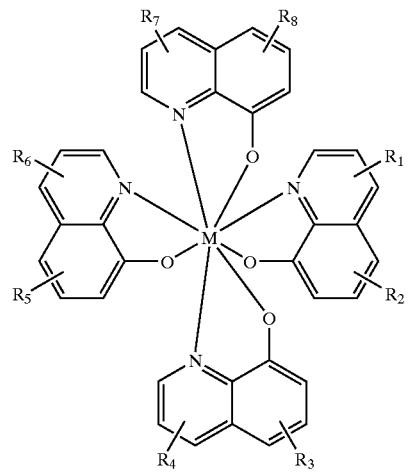

M may be selected from the group Ti, Zr, Hf, Nb, Re, Sn and Ge. The substituents R1 through R10 may be selected from the group consisting of alkyl and aryl groups. Each of R1 through R10 may represent no substitution, mono-, di-, or tri-substitution. The second organic layer may comprise a material having a dipole moment less than about 2.0 debyes, such that the device has an unmodified external quantum efficiency of at least about 3% and a lifetime of at least about 1000 hours at an initial photon flux of about $10^{18}$ photons/sr-sec. The second organic layer may comprise a metal complex having a plurality of ligands, wherein each ligand makes the same contribution to the highest occupied molecular orbital and the lowest unoccupied molecular orbital of the metal complex. The second organic layer may be in direct contact with the cathode, or there may be a separate organic layer between the second organic layer and the cathode. Other metal complexes having quinolate ligands may be used.

20 Claims, 4 Drawing Sheets

MATERIALS AND STRUCTURES FOR ENHANCING THE PERFORMANCE OR ORGANIC LIGHT EMITTING DEVICES

FIELD OF THE INVENTION

The present invention relates to organic light emitting devices (OLEDs), and more specifically to materials used in such devices.

RESEARCH AGREEMENTS

The claimed invention was made by, on behalf of, and/or in connection with one or more of the following parties to a joint university-corporation research agreement: Princeton University, The University of Southern California, and the Universal Display Corporation. The agreement was in effect on and before the date the claimed invention was made, and the claimed invention was made as a result of activities undertaken within the scope of the agreement.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be an fluorescent or phosphorescent small molecule emitter. A dendrimer may be a "small molecule," and it is believed that all dendrimers currently used in the field of OLEDs are small molecules.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

OLED devices are generally (but not always) intended to emit light through at least one of the electrodes, and one or more transparent electrodes may be useful in an organic opto-electronic devices. For example, a transparent electrode material, such as indium tin oxide (ITO), may be used as the bottom electrode. A transparent top electrode, such as disclosed in U.S. Pat. Nos. 5,703,436 and 5,707,745, which are incorporated by reference in their entireties, may also be used. For a device intended to emit light only through the bottom electrode, the top electrode does not need to be transparent, and may be comprised of a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

SUMMARY OF THE INVENTION

A device is provided, having an anode, a cathode, and a first organic layer disposed between the anode and the cathode. The first organic layer is capable of phosphorescent emissive when a voltage is applied between the anode and the cathode. A second organic layer disposed between the first organic layer and the cathode is also provided. The second organic layer is in direct contact with the first organic layer. The second organic layer may comprise a material having the structure:

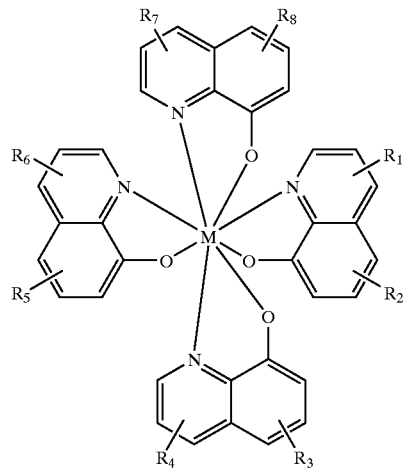

M may be selected from the group Ti, Zr, Hf, Nb, Re, Sn and Ge. The substituents R1 through R10 may be selected from the group consisting of alkyl and aryl groups. Each of R1 through R10 may represent no substitution, mono-, di-, or tri- substitution. The second organic layer may comprise a material having a dipole moment less than about 2.0 debyes, such that the device has an unmodified external quantum efficiency of at least about 3% and a lifetime of at least about 1000 hours at an initial photon flux of about $10^{18}$ photons/sr-sec. The second organic layer may comprise a metal complex having a plurality of ligands, wherein each ligand makes the same contribution to the highest occupied molecular orbital and the lowest unoccupied molecular orbital of the metal complex. The second organic layer may be in direct contact with the cathode, or there may be a separate organic layer between the second organic layer and the cathode. Other metal complexes having quinolate ligands may be used.

DETAILED DESCRIPTION

Figure 1:
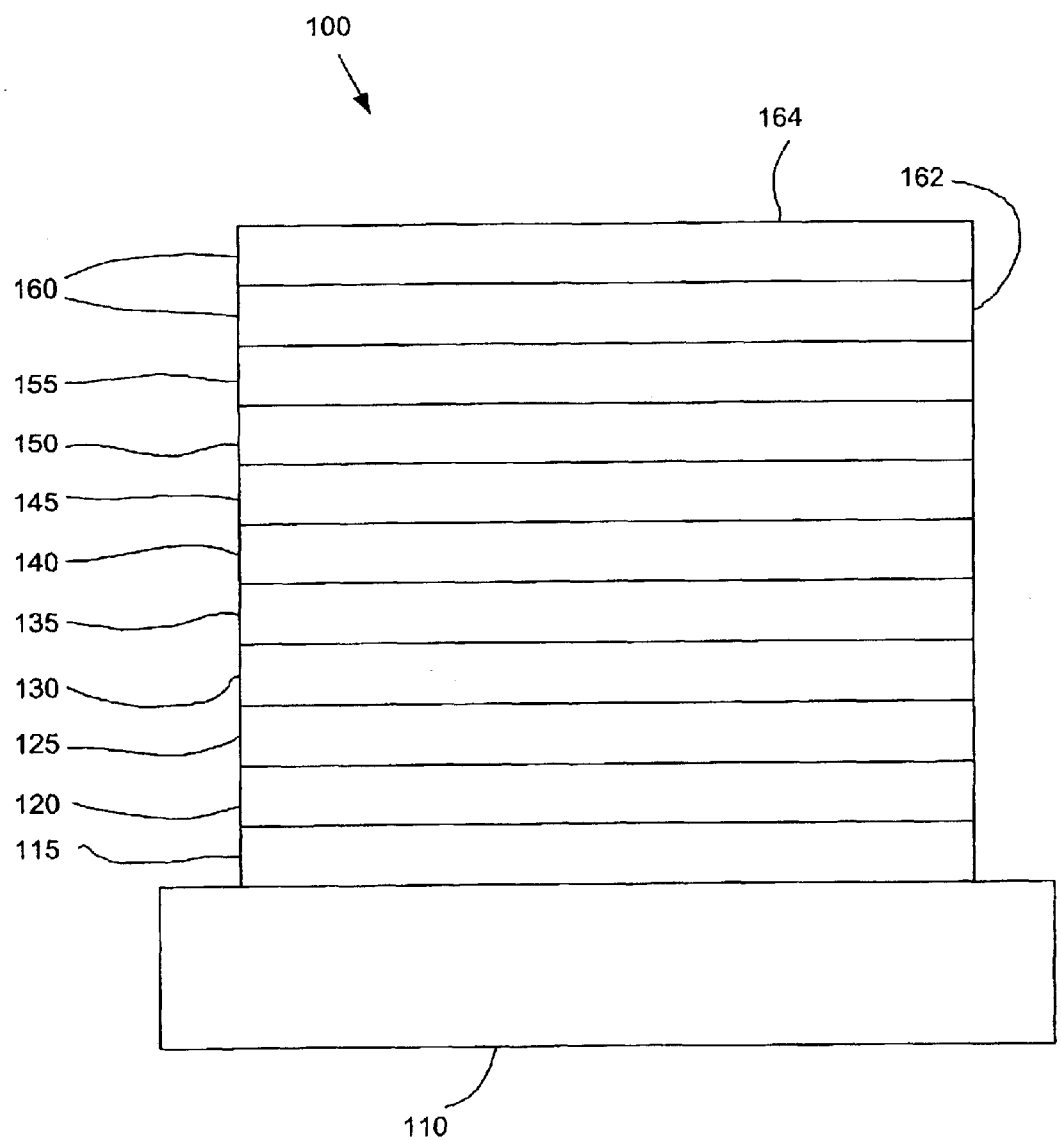
FIG. 1 shows an organic light emitting device having separate electron transport, hole transport, and emissive layers, as well as other layers.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151–154, 1998; ("Baldo-I") and Baldo et al., "Very high-efficiency green organic light-emitting devices based on electrophosphorescence," Appl. Phys. Lett., vol. 75, No. 3, 4–6 (1999) ("Baldo-II"), which are incorporated by reference in their entireties. Phosphorescence may be referred to as a "forbidden" transition because the transition requires a change in spin states, and quantum mechanics indicates that such a transition is not favored. As a result, phosphorescence generally occurs in a time frame exceeding at least 10 nanoseconds, and typically greater than 100 nanoseconds. If the natural radiative lifetime of phosphorescence is too long, triplets may decay by a non-radiative mechanism, such that no light is emitted. Organic phosphorescence is also often observed in molecules containing heteroatoms with unshared pairs of electrons at very low temperatures. 2,2'-bipyridine is such a molecule. Non-radiative decay mechanisms are typically temperature dependent, such that a material that exhibits phosphorescence at liquid nitrogen temperatures may not exhibit phosphorescence at room temperature. But, as demonstrated by Baldo, this problem may be addressed by selecting phosphorescent compounds that do phosphoresce at room temperature.

Generally, the excitons in an OLED are believed to be created in a ratio of about 3:1, i.e., approximately 75% triplets and 25% singlets. See, Adachi et al., "Nearly 100% Internal Phosphorescent Efficiency In An Organic Light Emitting Device," J. Appl. Phys., 90, 5048 (2001), which is incorporated by reference in its entirety. In many cases, singlet excitons may readily transfer their energy to triplet excited states via "intersystem crossing," whereas triplet excitons may not readily transfer their energy to singlet excited states. As a result, 100% internal quantum efficiency is theoretically possible with phosphorescent OLEDs. In a fluorescent device, the energy of triplet excitons is generally lost to radiationless decay processes that heat-up the device, resulting in much lower internal quantum efficiencies. OLEDs utilizing phosphorescent materials that emit from triplet excited states are disclosed, for example, in U.S. Pat. No. 6,303,238, which is incorporated by reference in its entirety.

Phosphorescence may be preceded by a transition from a triplet excited state to an intermediate non-triplet state from which the emissive decay occurs. For example, organic molecules coordinated to lanthanide elements often phosphoresce from excited states localized on the lanthanide metal. However, such materials do not phosphoresce directly from a triplet excited state but instead emit from an atomic excited state centered on the lanthanide metal ion. The europium diketonate complexes illustrate one group of these types of species.

Phosphorescence from triplets can be enhanced over fluorescence by confining, preferably through bonding, the organic molecule in close proximity to an atom of high atomic number. This phenomenon, called the heavy atom effect, is created by a mechanism known as spin-orbit coupling. Such a phosphorescent transition may be observed from an excited metal-to-ligand charge transfer (MLCT) state of an organometallic molecule such as tris(2-phenylpyridine)iridium(III).

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order.

Substrate 110 may be any suitable substrate that provides desired structural properties. Substrate 110 may be flexible or rigid. Substrate 110 may be transparent, translucent or opaque. Plastic and glass are examples of preferred rigid substrate materials. Plastic and metal foils are examples of preferred flexible substrate materials. Substrate 110 may be a semiconductor material in order to facilitate the fabrication of circuitry. For example, substrate 110 may be a silicon wafer upon which circuits are fabricated, capable of controlling OLEDs subsequently deposited on the substrate. Other substrates may be used. The material and thickness of substrate 110 may be chosen to obtain desired structural and optical properties.

Anode 115 may be any suitable anode that is sufficiently conductive to transport holes to the organic layers. The material of anode 115 preferably has a work function higher than about 4 eV (a "high work function material"). Preferred anode materials include conductive metal oxides, such as indium tin oxide (ITO) and indium zinc oxide (IZO), aluminum zinc oxide (AlZnO), and metals. Anode 115 (and substrate 110) may be sufficiently transparent to create a bottom-emitting device. A preferred transparent substrate and anode combination is commercially available ITO (anode) deposited on glass or plastic (substrate). A flexible and transparent substrate-anode combination is disclosed in U.S. Pat. No. 5,844,363, which is incorporated by reference in its entirety. Anode 115 may be opaque and/or reflective. A reflective anode 115 may be preferred for some top-emitting devices, to increase the amount of light emitted from the top of the device. The material and thickness of anode 115 may be chosen to obtain desired conductive and optical properties. Where anode 115 is transparent, there may be a range of thickness for a particular material that is thick enough to provide the desired conductivity, yet thin enough to provide the desired degree of transparency. Other anode materials and structures may be used.

Hole transport layer 125 may include a material capable of transporting holes. Hole transport layer 130 may be intrinsic (undoped), or doped. Doping may be used to enhance conductivity. α-NPD and TPD are examples of intrinsic hole transport layers. An example of a p-doped hole transport layer is m-MTDATA doped with $F_4$-TCNQ at a molar ratio of 50:1, as disclosed in United States Patent Application Publication No. 2003/0230980, which is incoporated by reference in its entirety. Other hole transport layers may be used.

Emissive layer 135 may include an organic material capable of emitting light when a current is passed between anode 115 and cathode 160. Preferably, emissive layer 135 contains a phosphorescent emissive material, although fluorescent emissive materials may also be used. Phosphorescent materials are preferred because of the higher luminescent efficiencies associated with such materials. Emissive layer 135 may also comprise a host material capable of transporting electrons and/or holes, doped with an emissive material that may trap electrons, holes, and/or excitons, such that excitons relax from the emissive material via a photoemissive mechanism. Emissive layer 135 may comprise a single material that combines transport and emissive properties. Whether the emissive material is a dopant or a major constituent, emissive layer 135 may comprise other materials, such as dopants that tune the emission of the emissive material. Emissive layer 135 may include a plurality of emissive materials capable of, in combination, emitting a desired spectrum of light. Examples of phosphorescent emissive materials include Ir(ppy)$_3$. Examples of fluorescent emissive materials include DCM and DMQA. Examples of host materials include Alq$_3$, CBP and mCP. Examples of emissive and host materials are disclosed in U.S. Pat. No. 6,303,238 to Thompson et al., which is incorporated by reference in its entirety. Emissive material may be included in emissive layer 135 in a number of ways. For example, an emissive small molecule may be incorporated into a polymer. Other emissive layer materials and structures may be used.

Electron transport layer 140 may include a material capable of transporting electrons. Electron transport layer 140 may be intrinsic (undoped), or doped. Doping may be used to enhance conductivity. Alq$_3$ is an example of an intrinsic electron transport layer. An example of an n-doped electron transport layer is BPhen doped with Li at a molar ratio of 1:1, as disclosed in United States Patent Application Publication No. 2003/0230980, which is incorporated by reference in its entirety. Other electron transport layers may be used.

The charge carrying component of the electron transport layer may be selected such that electrons can be efficiently injected from the cathode into the LUMO (Lowest Unoccupied Molecular Orbital) level of the electron transport layer. The "charge carrying component" is the material responsible for the LUMO that actually transports electrons. This component may be the base material, or it may be a dopant. The LUMO level of an organic material may be generally characterized by the electron affinity of that material and the relative electron injection efficiently of a cathode may be generally characterized in terms of the work function of the cathode material. This means that the preferred properties of an electron transport layer and the adjacent cathode may be specified in terms of the electron affinity of the charge carrying component of the ETL and the work function of the cathode material. In particular, so as to achieve high electron injection efficiency, the work function of the cathode material is preferably not greater than the electron affinity of the charge carrying component of the electron transport layer by more than about 0.75 eV, more preferably, by not more than about 0.5 eV. Most preferably, the electron affinity of the charge carrying component of the electron transport layer is greater than the work function of the cathode material. Similar considerations apply to any layer into which electrons are being injected.

Cathode 160 may be any suitable material or combination of materials known to the art, such that cathode 160 is capable of conducting electrons and injecting them into the organic layers of device 100. Cathode 160 may be transparent or opaque, and may be reflective. Metals and metal oxides are examples of suitable cathode materials. Cathode 160 may be a single layer, or may have a compound structure. FIG. 1 shows a compound cathode 160 having a thin metal layer 162 and a thicker conductive metal oxide layer 164. In a compound cathode, preferred materials for the thicker layer 164 include ITO, IZO, and other materials known to the art. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The part of cathode 160 that is in contact with the underlying organic layer, whether it is a single layer cathode 160, the thin metal layer 162 of a compound cathode, or some other part, is preferably made of a material having a work function lower than about 4 eV (a "low work function material"). Other cathode materials and structures may be used.

Blocking layers may be used to reduce the number of charge carriers (electrons or holes) and/or excitons that leave the emissive layer. An electron blocking layer 130 may be disposed between emissive layer 135 and the hole transport layer 125, to block electrons from leaving emissive layer 135 in the direction of hole transport layer 125. Similarly, a hole blocking layer 140 may be disposed between emissive layer 135 and electron transport layer 145, to block holes from leaving emissive layer 135 in the direction of electron transport layer 140. Blocking layers may also be used to block excitons from diffusing out of the emissive layer. The theory and use of blocking layers is described in more detail in U.S. Pat. No. 6,097,147 and United States Patent Application Publication No. 2003/0230980, which are incorporated by reference in their entireties. The conventional "blocking layer" is generally believed to reduce the number of charge carriers and/or excitons that leave the emissive layer by presenting an energy barrier that the charge carrer or exciton as difficulty surmounting. For example, hole transport is generally thought to be related to the Highest Occupied Molecular Orbital (HOMO) of a semiconductor. A "hole blocking" material may therefore be thought of as a material that has a HOMO energy level significantly less than that of the material from which the holes are being blocked. A first HOMO energy level is considered "less than" a second HOMO energy level if it is lower on a conventional energy level diagram, which means that the first HOMO energy level would have a value that is more negative than the second HOMO energy level in Table 2. For example, Ir(ppy)$_3$ has a HOMO energy level of −4.85 eV. Boron-1 has a HOMO energy level of −6.49 eV, which is 1.64 eV less than that of Ir(ppy)$_3$, making it an excellent hole blocker. ZrQ$_4$ has a HOMO energy level of −5.00, only 0.15 eV less than that of Ir(pp)$_3$, such that little or no hole blocking is expected. mer-GaQ$_3$ has a HOMO energy level −4.63 eV, which is greater than that of Ir(ppy)$_3$, such that no hole blocking at all is expected. If the emissive layer includes different materials with different energy levels, the effectiveness of these various materials as hole blocking layers may be different, because it is the difference in HOMO energy levels between the blocking layer and the blocked layer that is significant, not the absolute HOMO energy level. But, the absolute HOMO level may be useful in determining whether a compound will be a good hole blocker for particular emissive layers. For example, a material having a HOMO energy level of about −5.15 eV or greater may be considered a reasonable hole blocking material for Ir(ppy)$_3$, which is a desirable emissive material. Generally, a layer having a HOMO energy level that is at least 0.25 less than that of an adjacent layer may be considered as having some hole blocking properties. An energy level difference of at least 0.3 eV is preferred, and an energy level difference of at least 0.7 eV is more preferred. Similarly, the energy of an exciton is generally believed to be related to the band gap of a material. An "exciton blocking" material may generally be thought of as a material having a band gap significantly larger than the material from which excitons are being blocked. For example, a material having a band gap that is about 0.1 eV or more larger than that of an adjacent material may be considered a good exciton blocking material.

Generally, injection layers are comprised of a material that may improve the injection of charge carriers from one layer, such as an electrode or an organic layer, into an adjacent organic layer. Injection layers may also perform a charge transport function. In device 100, hole injection layer 120 may be any layer that improves the injection of holes from anode 115 into hole transport layer 125. CuPc is an example of a material that may be used as a hole injection layer from an ITO anode 115, and other anodes. In device 100, electron injection layer 150 may be any layer that improves the injection of electrons into electron transport layer 145. LiF/Al is an example of a material that may be used as an electron injection layer into an electron transport layer from an adjacent layer. Other materials or combinations of materials may be used for injection layers. Depending upon the configuration of a particular device, injection layers may be disposed at locations different than those shown in device 100. More examples of injection layers are provided in U.S. patent application Ser. No. 09/931,948 to Lu et al., which is incorporated by reference in its entirety. A hole injection layer may comprise a solution deposited material, such as a spin-coated polymer, e.g., PEDOT:PSS, or it may be a vapor deposited small molecule material, e.g., CuPc or MTDATA.

A hole injection layer (HIL) may planarize or wet the anode surface so as to provide efficient hole injection from the anode into the hole injecting material. A hole injection layer may also have a charge carrying component having HOMO (Highest Occupied Molecular Orbital) energy levels that favorably match up, as defined by their herein-described relative ionization potential (IP) energies, with the adjacent anode layer on one side of the HIL and the hole transporting layer on the opposite side of the HIL. The "charge carrying component" is the material responsible for the HOMO that actually transports holes. This component may be the base material of the HIL, or it may be a dopant. Using a doped HIL allows the dopant to be selected for its electrical properties, and the host to be selected for morphological properties such as wetting, flexibility, toughness, etc. Preferred properties for the HIL material are such that holes can be efficiently injected from the anode into the HIL material. In particular, the charge carrying component of the HIL preferably has an IP not more than about 0.7 eV greater that the IP of the anode material. More preferably, the charge carrying component has an IP not more than about 0.5 eV greater than the anode material. Similar considerations apply to any layer into which holes are being injected. HIL materials are further distinguished from conventional hole transporting materials that are typically used in the hole transporting layer of an OLED in that such HIL materials may have a hole conductivity that is substantially less than the hole conductivity of conventional hole transporting materials. The thickness of the HIL of the present invention may be thick enough to help planarize or wet the surface of the anode layer. For example, an HIL thickness of as little as 10 nm may be acceptable for a very smooth anode surface. However, since anode surfaces tend to be very rough, a thickness for the HIL of up to 50 nm may be desired in some cases.

A protective layer may be used to protect underlying layers during subsequent fabrication processes. For example, the processes used to fabricate metal or metal oxide top electrodes may damage organic layers, and a protective layer may be used to reduce or eliminate such damage. In device 100, protective layer 155 may reduce damage to underlying organic layers during the fabrication of cathode 160. Preferably, a protective layer has a high carrier mobility for the type of carrier that it transports (electrons in device 100), such that it does not significantly increase the operating voltage of device 100. CuPc, BCP, and various metal phthalocyanines are examples of materials that may be used in protective layers. Other materials or combinations of materials may be used. The thickness of protective layer 155 is preferably thick enough that there is little or no damage to underlying layers due to fabrication processes that occur after organic protective layer 160 is deposited, yet not so thick as to significantly increase the operating voltage of device 100. Protective layer 155 may be doped to increase its conductivity. For example, a CuPc or BCP protective layer 160 may be doped with Li. A more detailed description of protective layers may be found in U.S. patent application Ser. No. 09/931,948 to Lu et al., which is incorporated by reference in its entirety.

Figure 2:
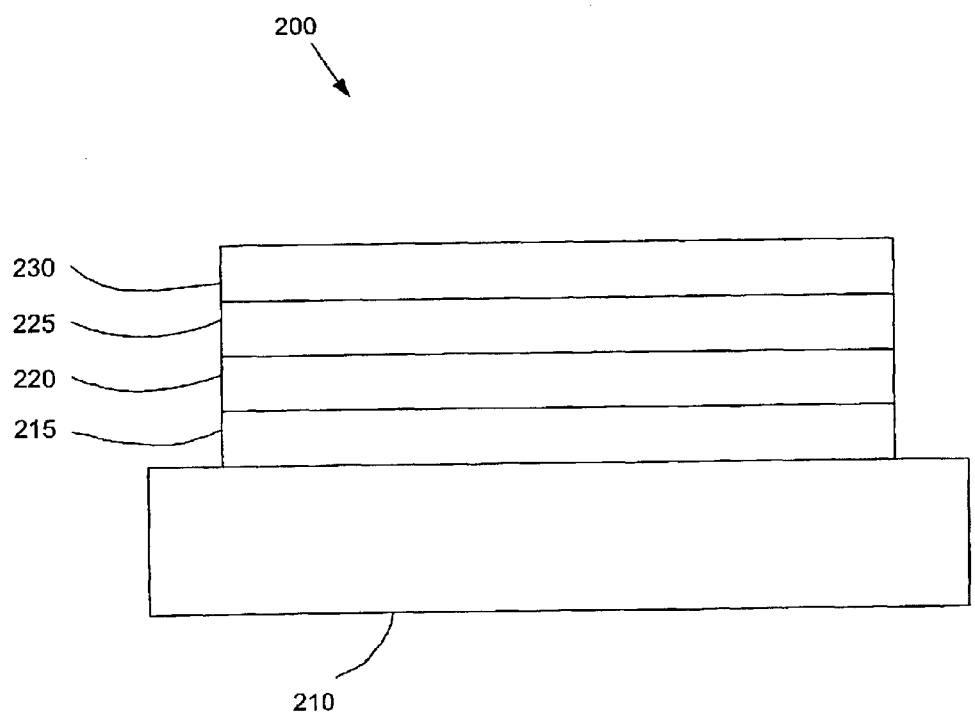
FIG. 2 shows an inverted organic light emitting device that does not have a separate electron transport layer.

FIG. 2 shows an inverted OLED 200. The device includes a substrate 210, an cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190, Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3–20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20–25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

As used herein, "solution processible" means capable of being dissolved, dispersed, or transported in and/or deposited from a liquid medium, either in solution or suspension form.

In an embodiment of the invention, an organic enhancement layer is provided that is disposed between the cathode and the emissive layer of an organic light emitting device. The organic enhancement layer is in direct contact with the emissive layer. In a preferred embodiment, the organic enhancement layer is also in direct contact with the cathode. The use of an organic enhancement layer allows for a simplified device structure that involves fewer processing steps during manufacture. For example, a hole blocking layer may be omitted. In addition, in some embodiments, a separate electron transport layer may be omitted.

Figure 3:
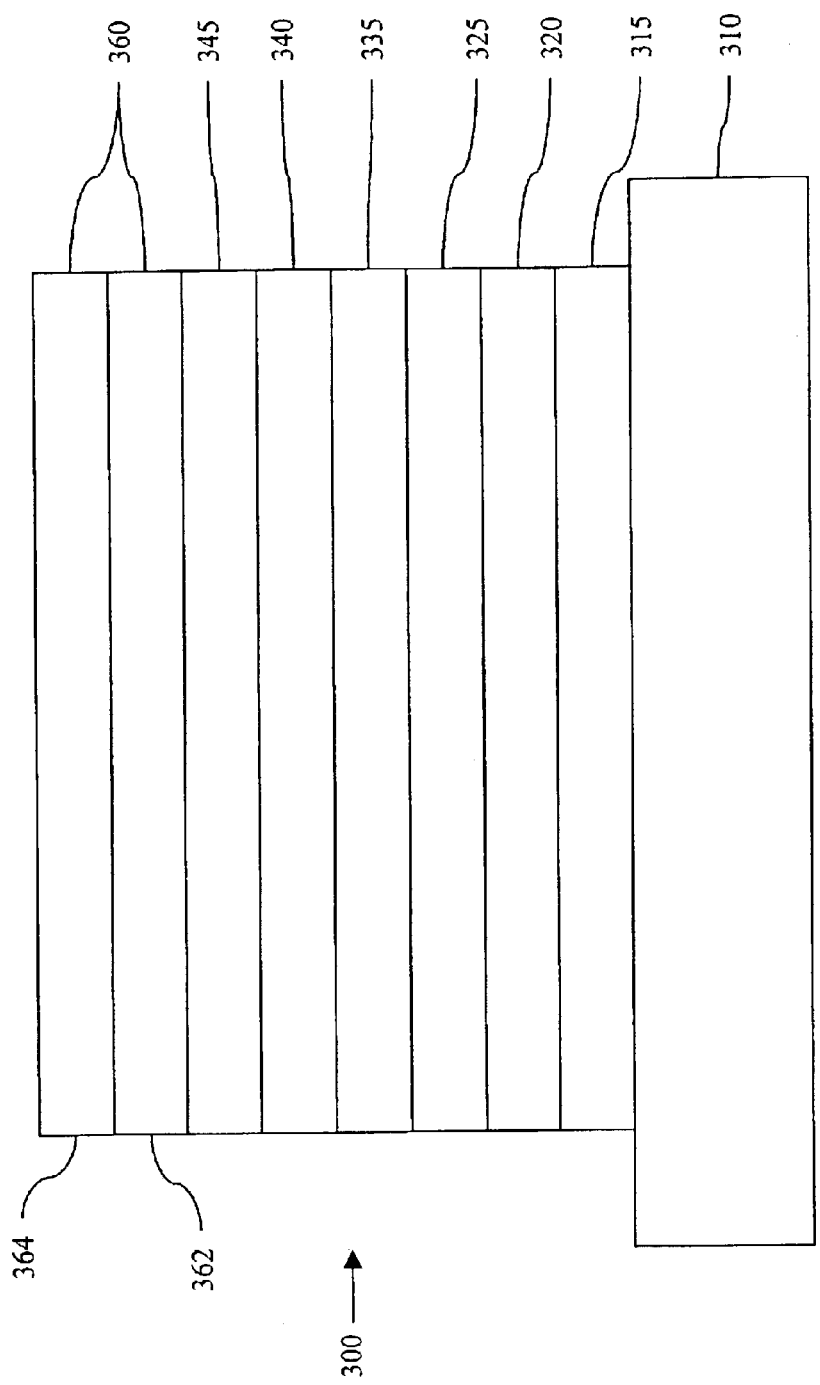
FIG. 3 shows a device having an organic enhancement layer that is not in direct contact with the cathode.

FIG. 3 shows a device 300 having an organic enhancement layer that is not in direct contact with the cathode, because there is a separate electron transport layer. Device 300 includes a substrate 310, an anode 315, a hole injection layer 320, a hole transport layer 325, an emissive layer 335, an organic enhancement layer 340, an electron transport layer 345, and a cathode 360. Cathode 360 includes a first conductive layer 362 and a second conductive layer 364. These layers operate analogously to similarly named substrate 110, anode 115, hole injection layer 120, hole transport layer 125, emissive layer 135, electron transport layer 145, and cathode 160 of FIG. 1.

Organic enhancement later 340 may improve device performance. Organic enhancement layer 340 is not necessarily a hole blocking layer, and may have a HOMO energy level that is greater than that of emissive layer 335, not more than 0.3 eV less than that of emissive layer 335, or not more than 0.7 eV less than that of emissive layer 335. Where the organic emissive layer includes multiple materials, such as a host and a dopant, the HOMO energy level of the emissive layer is considered to be that of the component that transports holes, which is generally the component having the highest HOMO energy level, provided that the component is present in an appreciable amount, for example about 3% or higher. For example, in a device having an emissive layer comprising CBP doped with Ir(ppy)$_3$, the HOMO level of Ir(ppy)$_3$, which is −4.85 eV, is the HOMO level relevant to charge transport, because it is higher than the HOMO level of CBP, −5.32 eV. Without intending to necessarily be limited to any theory of how the invention works, it is believed that organic enhancement layer 340 improves device performance by improving electron injection into emissive layer 335, and/or by having superior conductivity. Factors than may assist in achieving these propoerties include the use of a material in organic enhancement layer 340 having a low dipole moment, and/or the use of a metallic complex having ligands, where each ligand makes an equivalent contribution to the HOMO and LUMO orbitals of the metal complex due to the symmetry of the metal complex. In some embodiments, organic enhancement layer 340 may act as a hole blocking layer, which may further enhance device performance, but this is not necessary.

Figure 4:
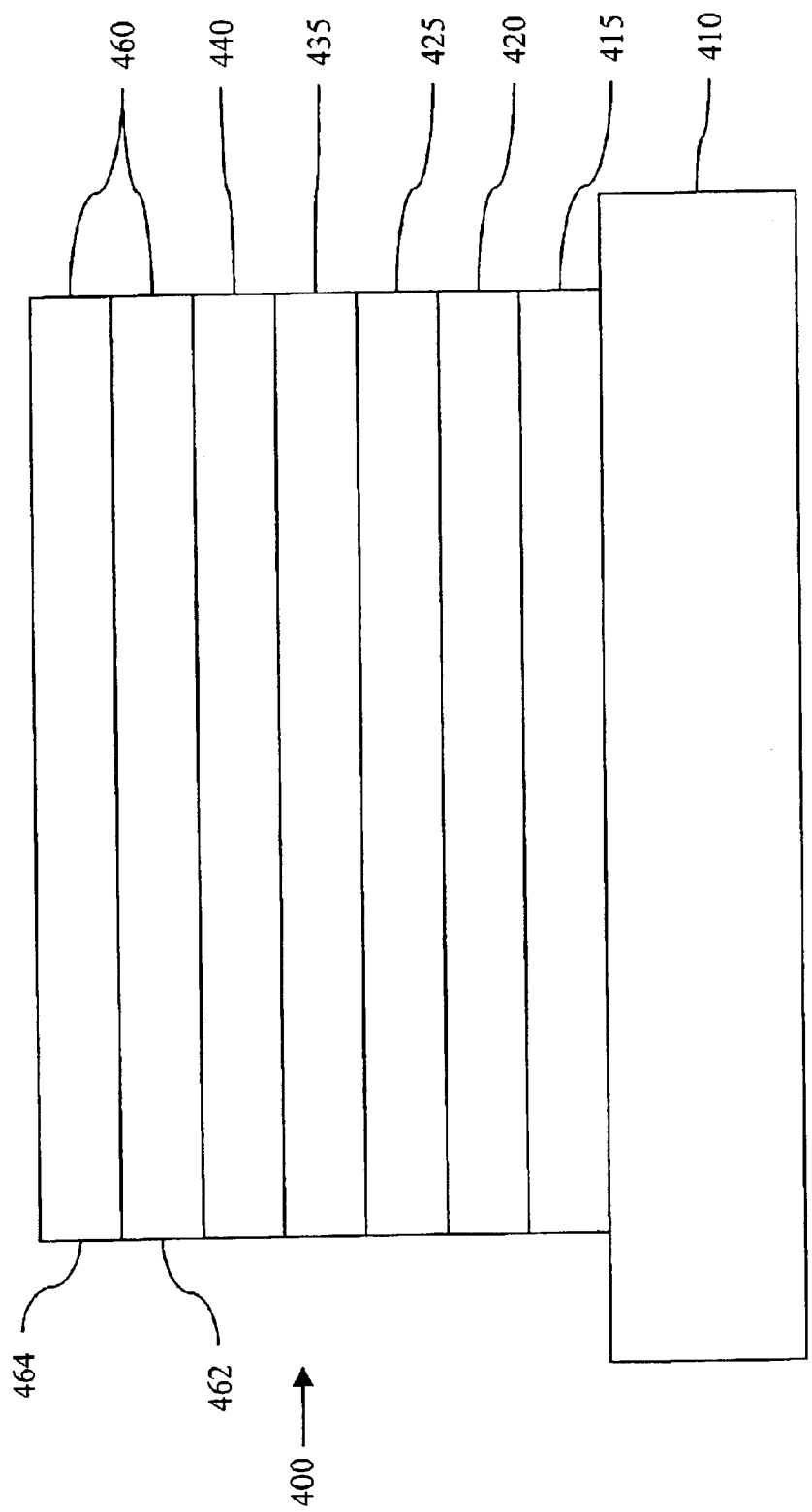
FIG. 4 shows a device having an organic enhancement layer that is in direct contact with the cathode.

FIG. 4 shows a device 400 having an organic enhancement layer that is in direct contact with the cathode. Device 400 includes a substrate 410, an anode 415, a hole injection layer 420, a hole transport layer 425, an emissive layer 435, an organic enhancement layer 440, and a cathode 460. Cathode 460 includes a first conductive layer 462 and a second conductive layer 464. These layers operate analogously to similarly named substrate 110, anode 115, hole injection layer 120, hole transport layer 125, emissive layer 135, and cathode 160 of FIG. 1. Organic enhancement layer 440 operates in a manner analogous to organic enhancement layer 340 of FIG. 3.

In the embodiment of FIG. 4, organic enhancement layer 440 is in direct contact with both emissive layer 435 and cathode 460, and there is no separate electron transport layer in addition to organic enhancement layer 440. As a result, device fabrication is simplified relative to a device having multiple layers between the emissive layer and the cathode. Yet, device performance in terms of lifetime and efficiency has been observed that is comparable to that of more complex devices having separate electron transport and hole blocking layers disposed between the emissive layer and the cathode.

In the embodiments of both FIG. 3 and FIG. 4, the organic enhancement layer is in direct contact with the emissive layer. It is understood that other layers illustrated in these Figures may not be needed, and that additional layers may be added. In addition, while FIGS. 3 and 4 both illustrate devices with the cathode on top, it is understood that other embodiments may be used with the cathode on bottom.

In one embodiment, the materials described herein as organic enhancement layers may also be used as electron transport layers, as illustrated by FIGS. 1 and 2. These materials may be superior electron transport materials due to their expected high intrinsic conductivity, particularly where an undoped electron transport layer is desired.

In one embodiment of the invention, the organic enhancement layer may include a metal complex including the following structure:

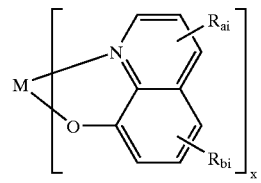

M is a metal selected from the group consisting of Ca, Sr, Ba, Ti, Zr, Hf, V, Nb, Mo, W, Mn, Tc, Re, Fe, Ru, Os, Ni, Pd, Pt, Zn, Cd, Hg, Ge, Sn, and Pd. Zr and Hf are preferred metals. x is the number of bidentate ligands that may be attached to the metal. For example, if M is Zr or Hf, then x is 4. Rai and Rbi each represent no substitution, mono-, di-, or tri-substitution. If there are substituents, the substituents may be selected independently from the group consisting of: alkyl and aryl groups. i is an integer that ranges from 1 to x, and represents the concept that Rai and Rbi may be different on the different ligands. If Ra1=Ra2=Ra3 and so on up to Rax, and Rb1=Rb2=Rb3 and so on up to Rbx, then all of the ligands are identical.

In one embodiment of the invention, the organic enhancement layer may include a metal complex having the following structure:

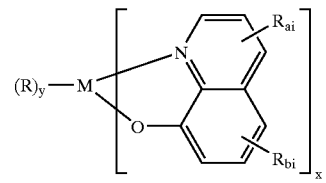

M is a metal selected from the group consisting of Ca, Sr, Ba, Ti, Zr, Hf, V, Nb, Mo, W, Mn, Tc, Re, Fe, Ru, Os, Ni, Pd, Pt, Zn, Cd, Hg, Ge, Sn, and Pd. Zr and Hf are preferred metals. x is the number of bidentate ligands that may be attached to the metal. For example, if M is Zr or Hf, then x is 4. Rai and Rbi each represent no substitution, mono-, di-, or tri-substitution. If there are substituents, the substituents may be selected independently from the group consisting of: alkyl and aryl groups. i is an integer that ranges from 1 to x, and represents the concept that Rai and Rbi may be different on the different ligands. If Ra1=Ra2=Ra3 and so on up to Rax, and Rb1=Rb2=Rb3 and so on up to Rbx, then all of the ligands are identical. R may be any ligand, and y may be any integer from zero up to the number of ligands that may be coordinated to the metal, while still allowing for x ligands as indicated. If y is greater than 1, the multiple R ligands may be the same ligand, or may be different ligands.

In one embodiment of the invention, the organic enhancement layer may include a material having the following structure:

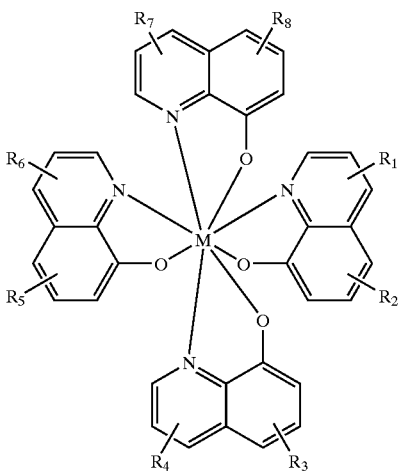

M is a metal selected from the group consisting of Ti, Zr, Hf, Nb, Re, Sn and Ge. Preferred metals include Zr and Hf. R1, R2, R3, R4, R5, R6, R7 and R8 each represent no substitution, mono-, di-, or tri-substitution. If there are substituents, the substituents may be selected independently from the group consisting of: aryl and alkyl groups.

In preferred embodiments of the invention, the organic enhancement layer may include $ZrQ_4$ or $HfQ_4$, which have the following structures:

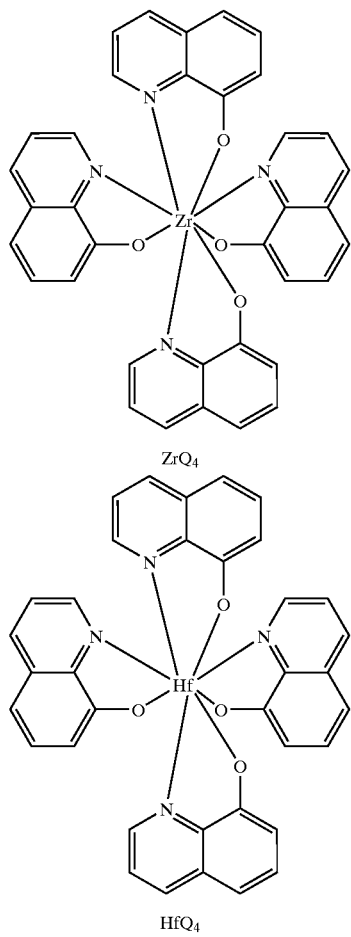

$ZrQ_4$ $HfQ_4$

In a typical phosphorescent device, it is believed that excitons are formed when electrons and holes meet and recombine in the emissive layer. It is also believed that this recombination generally occurs very close to where the electrons are injected into the emissive region. There are several possible reasons for this phenomenon. First, phosphoresecent emissive materials may have superior hole transport properties, such that a phosphorescent emissive layer has a higher hole mobility than electron mobility, and holes are quickly transported across the emissive layer, as compared to electrons, which are more slowly transported. Second, holes may be injected into the emissive layer more readily than electrons. "Hole blocking" layers may be used to prevent holes from leaving the emissive layer. Some degree of hole blocking may occur where the hole blocking layer has a HOMO energy level lower than that of the adjacent layer, usually an emissive layer, from which holes are being blocked. Effective hole blocking layers generally have a HOMO energy level significantly lower than that of the adjacent layer, such as 0.25 eV lower, preferably 0.3 eV lower or more preferably 0.7 eV lower.

Without necessarily being limited as to any particular theory as to how the invention works, it is believed that the organic enhancement layer may allow for efficient injection of electrons into the emissive layer. Instead of or in addition to "blocking" holes which then wait for electrons to trickle into the emissive layer, the organic enhancement layer may result in a flood of electrons that recombine with holes before they can reach the edge of the emissive layer. Superior electron injection properties may result from one of several properties of the organic enhancement layer material or materials.

In one embodiment, the use of an organic enhancement layer including a material having a low dipole moment may result in superior device performance. Without intending to limit all embodiments with a particular theory of how the invention works, it is believed that a low dipole moment may improve electron injection from the organic enhancement layer into the emissive layer, because the presence of a significant dipole moment may lead to a local electric field that can trap or slow down charge migration. As a result, the material may inject electrons into the emissive layer rapidly enough that a significant proportion of holes in the organic emissive layer encounter an electron and recombine before reaching the interface between the organic enhancement layer and the emissive layer. In some embodiments of the invention, the organic enhancement layer does not have energetics suitable for hole blocking, because hole blocking may not be needed due to superior electron injection. The organic enhancement layer may have a HOMO energy level that is not generally considered effective as a hole blocking layer. For example, the HOMO energy level of the organic enhancement layer may be greater than that of the emissive layer, in which case no hole blocking at all would be expected. By way of further example, the HOMO energy level of the organic enhancement layer may be less than that of the emissive layer, but the difference may be so small that significant hole blocking is not expected. For example, the difference in energy levels may be less than about 0.25 eV, about 0.3 eV, or about 0.7 eV.

In one embodiment, it is believed that the use of an organic enhancement layer including a metal complex having ligands that each make the same contribution to the highest occupied molecular orbital and the lowest unoccupied molecular orbital of the metal complex may result in superior device performance. Without intending to limit all embodiments with a particular theory of how the invention works, it is believed that this symmetric energy structure may improve electron injection from the organic enhancement layer into the emissive layer because the symmetry in the HOMO and LUMO may lead to better charge hopping as compared to assymetric analogs. Superior electron injection may enable superior device performance without necessarily using a blocking layer, as described above with respect to low dipole moment materials.

If it is assumed that electron transport occurs primarily on the quinolate ligand of metal quinolates, the energetic symmetry of ligand orbitals may play an important role in the material conductivity. LUMO electron density pictures were solved for the metal quinolate complexes, BAlQ, $ZrQ_4$ and $AlQ_3$ by DFT calculation (B3LYP 6-31G*) using the Spartan 02 software package. The LUMO orbitals for BAlQ were almost evenly distributed on two quinolate ligands that are trans with respect to each other. A slight difference in orbital density may be due to the influence of the lone electron pairs from the biphenoxy ligand which may be oriented randomly in an amorphous thin film. The X-ray structure of $ZrQ_4$ has been described in the literature. See Lewis et al., "X-ray crystal structure of tetrakis(8-quinolinolato)zirconium(IV), a dodecahedral M(AB)4 system," J. Chem. Soc. Chem. Commun. 1974, 1046–1047, which is incorporated by reference. $ZrQ_4$ exhibits S4 symmetry. Because of this, the LUMO of $ZrQ_4$ possesses even greater equivalency and has symmetric electron density on all four quinolate ligands. But the LUMO for $AlQ_3$ is quite different. Since $AlQ_3$ is an asymmetric meridional isomer, all three quinolate ligands have inequivalent energies. This results in one ligand that is lowest in energy where nearly all electron density is predicted to reside in the LUMO. This property of mer-$AlQ_3$ has been described in the literature by DFT calculation and compared to the hypothetical facial isomer of $AlQ_3$. See Curioni et al., "ab initio calculations of its structural and electronic properties in neutral and charged states," Chem. Phys. Lett. 1998, 294, 263–271, which is incorporated by reference. The facial isomer of $AlQ_3$ is predicted to have energetic equivalence similar to $ZrQ_4$ due to its C3 symmetry.

As electrons are expected to reside primarily on the LUMO orbitals, molecules with higher symmetry may show greater delocalization of the negative charge over the molecule. The enhanced delocalization of charge may increase the bulk conductivity, electron mobility and operational stability properties in a device.

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting. For example, theories relating to charge transfer are not intended to be limiting. While many embodiments of the invention allow for superior device performance in the absence of hole blocking, it is understood that some embodiments of the invention may be combined with hole blocking. Material Definitions:

| | As used herein, abbreviations refer to materials as follows: |
|---|---|
| CBP: | 4,4'-N,N-dicarbazole-biphenyl |
| m-MTDATA | 4,4',4"-tris(3-methylphenylphenlyamino)triphenylamine |
| Alq$_3$: | aluminum(III) tris(8-hydroxyquinolate) |

-continued

| | As used herein, abbreviations refer to materials as follows: |
|---|---|
| Bphen: | 4,7-diphenyl-1,10-phenanthroline |
| n-BPhen: | n-doped BPhen (doped with lithium) |
| $F_4$-TCNQ: | tetrafluoro-tetracyano-quinodimethane |
| p-MTDATA: | p-doped m-MTDATA (doped with $F_4$-TCNQ) |
| Ir(ppy)$_3$: | tris(2-phenylpyridine)-iridium |
| Ir(ppz)$_3$: | tris(1-phenylpyrazoloto,N,C(2')iridium(III) |
| BCP: | 2,9-dimethyl-4,7-diphenyl-1,10-phenanthroline |
| TAZ: | 3-phenyl-4-(1'-naphthyl)-5-phenyl-1,2,4-triazole |
| CuPc: | copper phthalocyanine. |
| ITO: | indium tin oxide |
| NPD: | naphthyl-phenyl-diamine |
| TPD: | N,N'-bis(3-methylphenyl)-N,N'-bis-(phenyl)-benzidine |
| BAlq: | aluminum(III)bis(2-methyl-8-quinolinato)4-phenylphenolate |
| mCP: | 1,3-N,N-dicarbazole-benzene |
| DCM: | 4-(dicyanoethylene)-6-(4-dimethylaminostyryl-2-methyl)-4H-pyran |
| DMQA: | N,N'-dimethylquinacridone |
| PEDOT:PSS: | an aqueous dispersion of poly(3,4-ethylenedioxythiophene) with polystyrenesulfonate (PSS) |
| $ZrQ_4$: | zirconium(IV) tetrakis(8-hydroxyquinolate) |
| $HfQ_4$: | hafnium(IV) tetrakis(8-hydroxyquinolate) |
| $GaQ_3$: | gallium(III) tris(8-hydroxyquinolate) |
| PBD: | 2-(4-biphenylyl)-5-phenyl-1,3,4-oxidiazole |
| TPBi: | 2,2',2"-(1,3,5-benzenetriiyl)tris-(1-phenyl-1H-benzimidazole) |
| Boron 1: | 1,4-Bis(diphenylboronyl)benzene |
| Boron 2: | Tris(2,3,5,6-tetramethylphenyl)borane |

Experimental

Specific representative embodiments of the invention will now be described, including how such embodiments may be made. It is understood that the specific methods, materials, conditions, process parameters, apparatus and the like do not necessarily limit the scope of the invention.

Device Fabrication and Measurement

Devices were fabricated using high vacuum (<$10^{-7}$ Torr) thermal evaporation to deposit all layers, except for the substrate and anode, which were obtained from Applied Films Corp. of Longmont, Colo.

For all devices, the substrate was 1.1 mm thick soda lime glass, and the anode was about 1200 Å of indium tin oxide (ITO). Organic layers were deposited over the anode as described below. A cathode was then deposited over the organic layers. The cathode included 10 Å of LiF followed by 1,000 Å of Al. All devices were encapsulated with a glass lid sealed with an epoxy resin in a nitrogen glove box (<1 ppm of $H_2O$ and $O_2$) immediately after fabrication, and a moisture getter was incorporated inside the package. Lifetest was conducted at constant direct current drive at room temperature. Lifetime is defined as the time required for the initial luminance ($L_0$) to drop to 50%.

Devices 1–4 and 10–11

For each of devices 1–4 and 10–11, the organic stack consists of 100 Å thick of copper phthalocyanine (CuPc) as the hole injection layer (HIL), 300 Å of 4,4'-bis[N-(1-naphthyl)-N-phenylamino]biphenyl (α-NPD), as the hole transporting layer (HTL), 300 Å of 4,4'-bis(N-carbazolyl) biphenyl (CBP) doped with 6 wt % of fac-tris(2-phenylpyridine)iridium [Ir(ppy)$_3$] as the emissive layer (EML). Over the EML, either one or two electron transport layers (ETL) were deposited as specified in Table 1, with ETL2 being deposited directly over the EML, and ETL1 (where present) being deposited over ETL2. ETL2 was 100 Å thick, and was a metal quinolate in each device (see Table 1, column ETL2). The ETL1 was 400 Å thick, and was a metal quinolate in each device (see Table 1, column ETL1).

The cathode was deposited directly over ETL1, or over ETL2 for those devices where ETL1 was not present.

Devices 5–9

For each of examples 5–9, the organic stack included the same CuPc HIL, α-NPD HTL, and CBP EML doped with 6 wt % Ir(ppy)$_3$ as devices 1–4 and 10–11. ETL2 was 400 Å thick, and was a metal quinolate in each device (see table, column ETL2). There was no ETL1 layer, and the cathode was deposited directly over ETL2.

The current-voltage-luminance (IVL) characteristics and operational lifetime were measured for each of devices 1–11 and are summarized in Table 1. External quantum efficiency was compared at 600 cd/m$^2$, which is a typical brightness for green emitting devices. The efficiency may be referred to as "unmodified external quantum efficiency" because no measures were taken to increase outcoupling, such as roughening the substrate. For purposes on comparing the effect of the organic layer structure on efficiency relative to other devices, devices having similar outcoupling should be compared, or a calculation should be performed to adjust for the effect of any outcoupling improvements.

TABLE 1

| Device | ETL2 | ETL1 | External Quantum Efficiency at 600 cd/m$^2$ | % luminance retained at 100 hrs at $L_0$ = 600 cd/m$^2$ |
|---|---|---|---|---|
| 1 | Zrq$_4$ | Alq$_3$ | 5.01 | 52 |
| 2 | Hfq$_4$ | Alq$_3$ | 5.29 | not determined |
| 3 | BAlq | Alq$_3$ | 6.13 | 95 |
| 4 | Gaq$_3$ | Alq$_3$ | 2.76 | not determined |
| 5 | Zrq$_4$ | none | 5.24 | 94 |
| 6 | Hfq$_4$ | none | 4.87 | not determined |
| 7 | BAlq | none | 5.57 | 92 |
| 8 | Alq$_3$ | none | 3.06 | 70 |
| 9 | Gaq$_3$ | none | 2.65 | not determined |
| 10 | BAlq | Zrq$_4$ | 5.91 | 97 |
| 11 | BAlq | Hfq$_4$ | 5.91 | not determined |

The devices illustrate that a low dipole moment and a high degree of symmetry in an organic enhancement layer immediately adjacent to an EML may improve device performance. For example, device 8 has a single layer of Alq$_3$ between the cathode and the EML. Devices 1 and 2 are similar to device 8, but include an additional layer of ZrQ$_4$ or HfQ$_4$ between the Alq$_3$ and the EML. Devices 1 and 2 exhibit improved efficiency over device 8 due to this additional layer. Because the calculated HOMO energy levels for ZrQ$_4$, HfQ$_4$ and Alq$_3$ are about the same (Table 2), the difference in efficiency may not be explained by a difference in hole blocking properties, which are generally thought to depend upon HOMO energy levels. ZrQ$_4$ and HfQ$_4$ have zero dipole moments, while Alq$_3$ has a dipole moment of about 4.42 debyes. It is believed that this difference in dipole moments may contribute to the superior performance of devices 1 and 2 relative to device 8. Similarly, it is believed that ZrQ$_4$ and HfQ$_4$ have a symmetry such that each ligand makes an equivalent contribution to the HOMO and LUMO orbitals of the metal complex, whereas AlQ$_3$ does not. It is believed that this difference in symmetry may also contribute to the superior performance of devices 1 and 2 relative to device 8.

Device 3 is similar to devices 1 and 2, but has a Gaq$_3$ layer immediately adjacent to the EML, and exhibits poor efficiency. It is believed that the GaQ$_3$ layer is a combination of the mer- and fac-isomers. Both isomers have high dipole moments, 6.32 debyes and 8.85 debyes, respectively. The mer-isomer has a HOMO greater than that of Ir(ppy)$_3$, and the fac-isomer has a HOMO level that is only 0.08 eV less than that of Ir(ppy)$_3$ such that there should be very little or no hole blocking. The combination of little or no hole blocking and high dipole moment results in poor efficiency.

A comparison of devices 1 and 2 with device 3 further illustrates that, although hole blocking may affect device performance, low dipole moment and symmetry may also have an effect. Device 3 has a layer of BAlq immediately adjacent to the EML. BAlq, with a HOMO that is 0.26 eV lower than that of Ir(ppy)$_3$, is a borderline hole blocking material for an Ir(ppy)$_3$ device. BAlq also has a dipole moment of 2.17 debyes, and has different ligands that make different contributions to the HOMO and LUMO energy levels of the molecule. Devices 1 and 2 have layers of ZrQ$_4$ and HfQ$_4$, respectively, immediately adjacent to the EML. These materials are not good hole blockers, with HOMO levels only 0.15 eV and 0.2 eV less than that of Ir(ppy)$_3$, respectively. But ZrQ$_4$ and HfQ$_4$ have zero dipole moments, and are both metallic complexes having ligands that each make an equivalent contribution to the HOMO and LUMO orbitals of the metal complex due to the symmetry of the metal complex, which may result in efficiencies comparable to that of Device 3.

Devices 5 and 6 show that a simplified device structure, having only a single layer between the cathode and the emissive layer, can result in good device performance in terms of both efficiency and lifetime, even where the single layer does not necessarily act as a blocker of holes from the emissive layer.

Calculations

Density functional calculations were performed using the Spartan 02 software package, available from Wavefunction Inc. of Irvine, Calif., at the B3LYP/6-31G* level. A pseudo potential option was used for species containing heavy metals such as Ir(ppy)$_3$ and HfQ$_4$, but not for other species. The calculation results in a minimized ground state equilibrium geometry (assumed gas phase), and the magnitude and direction of the dipole moment is given in the units of debye. Density functional calculations have been demonstrated in the literature to be able to qualitatively predict energies and structures of organic and inorganic compounds. These calculated values are used throughout the specification.

TABLE 2

| Compound | HOMO (eV) | LUMO eV | Dipole |
|---|---|---|---|
| mer-AlQ$_3$ | −5.00 | −1.73 | 4.42 |
| BAlQ | −5.11 | −1.76 | 2.17 |
| mer-GaQ$_3$ | −4.63 | −1.91 | 6.32 |
| fac-GaQ$_3$ | −4.93 | −1.66 | 8.85 |
| ZrQ$_4$ | −5.00 | −1.65 | 0.00 |
| HfQ$_4$ | −5.05 | −1.68 | 0.03 |
| BCP | −5.87 | −1.17 | 2.89 |
| PBD | −5.85 | −1.66 | 3.75 |
| TAZ | −5.71 | −1.66 | 6.00 |
| TPBi | −5.70 | −1.25 | 5.63 |
| fac-Ir(ppy)$_3$ | −4.85 | −1.21 | 6.14 |
| CBP | −5.32 | −1.23 | 0.00 |
| Boron-1 | −6.49 | −2.02 | 0.00 |
| Boron-2 | −5.80 | −1.38 | 0.02 |

Several trends are noted for the dipole moments of the series of OLED materials shown in Table 2. In general, tris-quinolates, such as AlQ$_3$ and fac and mer GaQ$_3$ are predicted to have higher dipole moments compared to bis-quinolates and tetra-quinolates, such as BAlQ, ZrQ$_4$ and HfQ$_4$. The tris-quinolates may have two different isomer structures, facial (fac) and meridional (mer). As shown in the calculations, the dipole moment for fac-GaQ$_3$ is much greater than its meridional isomer. While facial isomers are more symmetric, the dipole moments of the ligands may point in the same direction combining the effects. The crystal structure for the tetraquinoline complex $ZrQ_4$ indicates that the complex exhibits S4 symmetry, even though the complex may not be in the S4 point group. As a result, the complex has a zero dipole moment. $HfQ_4$ has structural characteristics similar to $ZrQ_4$, as confirmed by nuclear magnetic resonance spectroscopy (NMR), and is thus assumed to have the same structural configuration as $ZrQ_4$.

It is also observed that materials with electron deficient nitrogen containing heterocycles, commonly used a hole blocking materials in phosphorescent OLEDs have higher dipole moments compared to hole blocking aromatic hydrocarbons or their derivatives with higher structural symmetry such as Boron-1 and Boron-2.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. A device, comprising:

an anode;

a cathode;

an first organic layer disposed between the anode and the cathode, wherein the first organic layer is capable of phosphorescent emissive when a voltage is applied between the anode and the cathode;

a second organic layer disposed between the first organic layer and the cathode, wherein the second organic layer is in direct contact with the first organic layer, and wherein the second organic layer comprises a material having the structure:

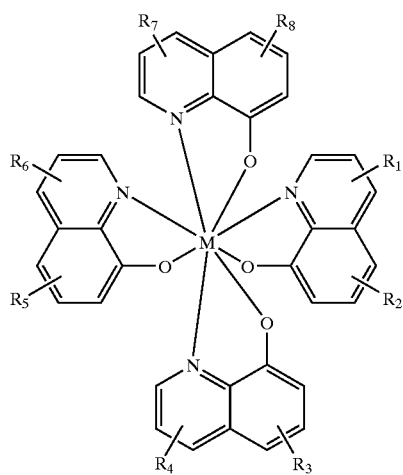

wherein:
M is a metal selected from the group consisting of Ti, Zr, Hf, Nb, Re, Sn and Ge;
R1, R2, R3, R4, R5, R6, R7 and R8 each represent no substitution, mono-, di-, or tri-substitution, and wherein the substituents are independently selected from the group consisting of: alkyl and aryl groups.

2. The device of claim 1, wherein M is Zr.

3. The device of claim 1, wherein M is Hf.

4. The device of claim 1, wherein there is no substitution.

5. The device of claim 2, wherein there is no substitution.

6. The device of claim 1, wherein the second organic layer is in direct contact with the cathode.

7. The device of claim 1, further comprising a third organic layer disposed between the second organic layer and the cathode.

8. A device, comprising:

an anode;

a cathode;

an first organic layer disposed between the anode and the cathode, wherein the first organic layer is capable of phosphorescent emissive when a voltage is applied between the anode and the cathode;

a second organic layer disposed between the first organic layer and the cathode, wherein the second organic layer is in direct contact with the first organic layer, and wherein the second organic layer comprises a material having the structure:

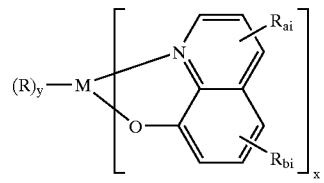

wherein:

x is an integer from 2 to 4, defining a number of quinolate ligands;

y is an integer from 0 to 3;

M is a metal selected from the group consisting of Ca, Sr, Ba, Ti, Zr, Hf, V, Nb, Mo, W, Mn, Tc, Re, Fe, Ru, Os, Ni, Pd, Pt, Zn, Cd, Hg, Ge, Sn, and Pd;

i ranges from 1 to x;

Rai and Rbi each represent no substitution, mono-, di-, or tri-substitution, and wherein the substituents are independently selected from the group consisting of: alkyl and aryl groups.

9. The device of claim 8, wherein Rai is the same on each ligand, and Rbi is the same on each ligand.

10. The device of claim 8, wherein the second organic layer is in direct contact with the cathode.

11. The device of claim 8, wherein the second organic layer comprises a

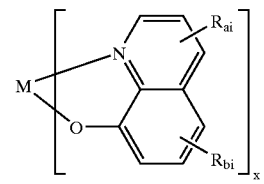

material having the structure:
wherein y=0 and $2 \leq X \leq 4$.

12. The device of claim 11, wherein the second organic layer is in direct contact with the cathode.

13. A device, comprising:

an anode;

a cathode;

an first organic layer disposed between the anode and the cathode, wherein the first organic layer is capable of phosphorescent emissive when a voltage is applied between the anode and the cathode;

a second organic layer disposed between the first organic layer and the cathode, wherein the second organic layer is in direct contact with the first organic layer, and wherein the second organic layer comprises a material having the structure:

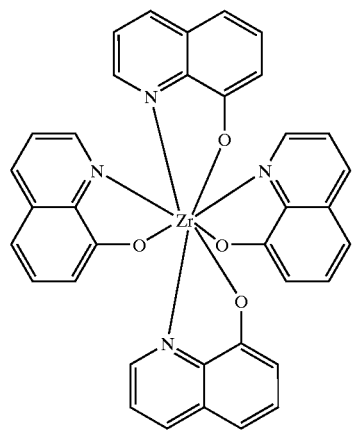

14. The device of claim 13, wherein the second organic layer is in direct contact with the cathode.

15. A device, comprising:

an anode;

a cathode;

an first organic layer disposed between the anode and the cathode, wherein the first organic layer is capable of phosphorescent emissive when a voltage is applied between the anode and the cathode;

a second organic layer disposed between the first organic layer and the cathode, wherein the second organic layer is in direct contact with the first organic layer, and wherein the second organic layer comprises a material having the structure

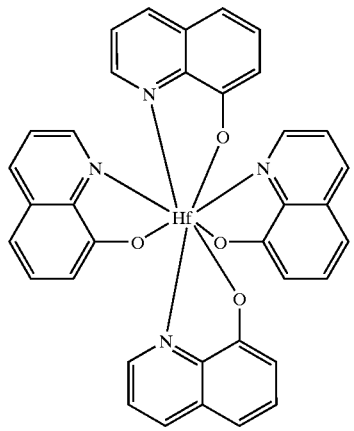

16. The device of claim 15, wherein the second organic layer is in direct contact with the cathode.

17. A device, comprising:

an anode;

a cathode;

an first organic layer disposed between the anode and the cathode, wherein the first organic layer is capable of phosphorescent emissive when a voltage is applied between the anode and the cathode;

a second organic layer disposed between the first organic layer and the cathode, wherein the second organic layer is in direct contact with the first organic layer, and wherein the second organic layer comprises an organic material having a dipole moment less than about 2.0 debyes, and a highest occupied molecular orbital energy level that is not more than 0.7 eV less than the highest occupied molecular orbital energy level of the organic material in the first organic layer.

18. The device of claim 17, wherein the second organic material comprises a material having a highest occupied molecular orbital energy level that is not more than 0.3 eV less than the highest occupied molecular orbital energy level of the hole transporting material in the first organic layer.

19. The device of claim 17, wherein the second organic material comprises a material having a highest occupied molecular orbital energy level that is not more than 0.25 eV less than the highest occupied molecular orbital energy level of the hole transporting material in the first organic layer.

20. The device of claim 17, wherein the second organic material comprises a material having a highest occupied molecular orbital energy level that is greater than the highest occupied molecular orbital energy level of the hole transporting material in the first organic layer.

* * * * *

UNITED STATES PATENT AND TRADEMARK OFFICE
CERTIFICATE OF CORRECTION

PATENT NO. : 6,902,833 B2
DATED : June 7, 2005
INVENTOR(S) : Thompson et al.

It is certified that error appears in the above-identified patent and that said Letters Patent is hereby corrected as shown below:

Title page, Item [54] and Column 1, line 2,
Title, change "OR" to -- OF --.

Column 2,
Line 40, change "emissive" to -- emission --.

Column 5,
Line 34, change "incoporated" to -- incorporated --.

Column 11,
Line 26, change "propoerties" to -- properties --.

Column 14,
Line 8, change "phosphoresecent" to -- phosphorescent --.

Column 15,
Line 5, change "assymetric" to -- asymmetric --.

Column 20,
Line 55, change "comprises a (diagram) material having the structure wherein y = 0..."
to -- comprises a material having the structure (diagram) wherein y = 0.... --.

Signed and Sealed this

Twentieth Day of December, 2005

JON W. DUDAS
*Director of the United States Patent and Trademark Office*

UNITED STATES PATENT AND TRADEMARK OFFICE
CERTIFICATE OF CORRECTION

PATENT NO. : 6,902,833 B2
DATED : June 7, 2005
INVENTOR(S) : Thompson et al.

It is certified that error appears in the above-identified patent and that said Letters Patent is hereby corrected as shown below:

Column 7,
Line 7, change "carrer" to -- carrier --.

Signed and Sealed this

Seventh Day of February, 2006

JON W. DUDAS
*Director of the United States Patent and Trademark Office*